(12) United States Patent
Li et al.

(10) Patent No.: US 9,595,918 B2
(45) Date of Patent: Mar. 14, 2017

(54) STABLE MICROWAVE-FREQUENCY SOURCE BASED ON CASCADED BRILLOUIN LASERS

(71) Applicant: California Institute of Technology, Pasadena, CA (US)

(72) Inventors: Jiang Li, Pasadena, CA (US); Kerry Vahala, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 181 days.

(21) Appl. No.: 14/640,031

(22) Filed: Mar. 6, 2015

(65) Prior Publication Data
US 2015/0311662 A1    Oct. 29, 2015

Related U.S. Application Data

(60) Provisional application No. 61/949,129, filed on Mar. 6, 2014.

(51) Int. Cl.
*H03B 17/00* (2006.01)
*H01S 3/30* (2006.01)
(Continued)

(52) U.S. Cl.
CPC .............. *H03B 17/00* (2013.01); *H01S 3/302* (2013.01); *H01S 3/005* (2013.01);
(Continued)

(58) Field of Classification Search
CPC .... H01S 3/005; H01S 3/06791; H01S 3/0809; H01S 3/09415; H01S 3/1312;
(Continued)

(56) References Cited

U.S. PATENT DOCUMENTS

| 4,461,672 A | 7/1984 | Musser |
| 4,938,841 A | 7/1990 | Shahar et al. |

(Continued)

FOREIGN PATENT DOCUMENTS

| JP | 2010-050758 A | 3/2010 |
| KR | 10-0796258 B1 | 1/2008 |
| WO | 2013-063586 A1 | 5/2013 |

OTHER PUBLICATIONS

L. Goldberg, H. F. Taylor, J. F.Weller, and D. M. Bloom, "Microwave signal generation with injection locked laser diodes," Electron. Lett. 19, 491-493 (1983).
(Continued)

*Primary Examiner* — Francis M Legasse, Jr.
(74) *Attorney, Agent, or Firm* — Steinfl+Bruno LLP; David S. Alavi

(57) ABSTRACT

A microwave-frequency source, generating an output electrical signal at an output frequency $f_M$, comprises a pump laser source, an optical resonator, and a photodetector. Free spectral range $v_{FSR}$ of the optical resonator equals an integer submultiple of a Brillouin shift frequency $v_B$ of the optical resonator (i.e., $v_B = Mv_{FSR}$). The pump laser source is frequency-locked to a corresponding resonant optical mode of the optical resonator. Pumping the optical resonator with output of the pump laser source at a pump frequency $v_{pump}$ results in stimulated Brillouin laser oscillation in the optical resonator at respective first, second, and third Stokes Brillouin-shifted frequencies $v_1 = v_{pump} - v_B$, $v_2 = v_{pump} - 2v_B$, and $v_3 = v_{pump} - 3v_B$. The photodetector receives stimulated Brillouin laser outputs at the first and third Stokes Brillouin-shifted frequencies $v_1$ and $v_3$ and generates therefrom the output electrical signal at a beat frequency $f_M = v_1 - v_3 = 2v_B$. The output electrical signal at the output frequency $f_M$ exhibits exceptionally low phase noise.

29 Claims, 6 Drawing Sheets

(51) Int. Cl.

| | |
|---|---|
| H01S 3/067 | (2006.01) |
| H01S 3/0941 | (2006.01) |
| H01S 3/131 | (2006.01) |
| H01S 5/00 | (2006.01) |
| H01S 3/00 | (2006.01) |
| H01S 3/08 | (2006.01) |

(52) U.S. Cl.
CPC ......... *H01S 3/06791* (2013.01); *H01S 3/0809* (2013.01); *H01S 3/09415* (2013.01); *H01S 3/1312* (2013.01); *H01S 5/0085* (2013.01)

(58) Field of Classification Search
CPC ....... H01S 3/302; H01S 5/0085; H03B 17/00; G02F 1/35; H04B 10/2537; G01J 3/4412; G01K 2011/322
See application file for complete search history.

(56) References Cited

U.S. PATENT DOCUMENTS

| | | | |
|---|---|---|---|
| 5,398,256 | A | 3/1995 | Homimer et al. |
| 5,872,022 | A | 2/1999 | Motoda et al. |
| 6,044,192 | A | 3/2000 | Grant et al. |
| 6,891,864 | B2 | 5/2005 | Vahala et al. |
| 6,895,133 | B1 | 5/2005 | Calkins et al. |
| 7,142,570 | B2 | 11/2006 | Lee et al. |
| 7,272,160 | B1 | 9/2007 | Geng et al. |
| 7,515,617 | B1 | 4/2009 | Vahala et al. |
| 7,590,326 | B2 | 9/2009 | Fincato et al. |
| 7,616,850 | B1 | 11/2009 | Watts et al. |
| 7,929,589 | B1 | 4/2011 | Ilchenko et al. |
| 8,045,834 | B2 | 10/2011 | Painter et al. |
| 8,094,987 | B2 | 1/2012 | Armani |
| 8,102,597 | B1 | 1/2012 | Maleki |
| 8,377,320 | B2 | 2/2013 | Wang et al. |
| 8,761,555 | B2 | 6/2014 | Matsko et al. |
| 8,818,146 | B2 | 8/2014 | Li et al. |
| 8,848,760 | B2 | 9/2014 | Vahala et al. |
| 8,917,444 | B2 | 12/2014 | Li et al. |
| 9,042,003 | B2 | 5/2015 | Li et al. |
| 2001/0014106 | A1 | 8/2001 | Gevorgian et al. |
| 2001/0030796 | A1 | 10/2001 | Yao |
| 2002/0181041 | A1 | 12/2002 | Tong |
| 2004/0179573 | A1 | 9/2004 | Armani et al. |
| 2005/0111776 | A1 | 5/2005 | Martin et al. |
| 2005/0163185 | A1 | 7/2005 | Vahala et al. |
| 2005/0169331 | A1 | 8/2005 | Vahala et al. |
| 2006/0187537 | A1 | 8/2006 | Huber et al. |
| 2007/0127930 | A1 | 6/2007 | Prodanov et al. |
| 2007/0230856 | A1 | 10/2007 | Yamazaki |
| 2008/0075464 | A1 | 3/2008 | Maleki et al. |
| 2008/0203052 | A1 | 8/2008 | Hossein-Zadeh et al. |
| 2009/0028504 | A1 | 1/2009 | Wu et al. |
| 2009/0285542 | A1 | 11/2009 | Armani et al. |
| 2011/0090936 | A1 | 4/2011 | Kupershmidt |
| 2011/0134940 | A1* | 6/2011 | Hartog ............... G01D 5/35335 372/6 |
| 2012/0320448 | A1 | 12/2012 | Li et al. |
| 2012/0321245 | A1 | 12/2012 | Vahala et al. |
| 2013/0010819 | A1 | 1/2013 | Ahmad et al. |
| 2013/0083813 | A1 | 4/2013 | Hartog |
| 2013/0163620 | A1 | 6/2013 | Lecoeuche |
| 2015/0092808 | A1* | 4/2015 | Li ....................... H01S 5/1075 372/95 |

OTHER PUBLICATIONS

Pillet, G., Morvan, L., Brunel, M., Bretenaker, F., Dolfi, D., Vallet, M., Huignard, J.-P., and Le Floch, A., "Dual frequency laser at 1.5 μm for optical distribution and generation of high-purity microwave signals," J. Lightwave Technol. 26, 2764-2773 (2008).

Schneider, G. J., Murakowski, J. A., Schuetz, C. A., Shi, S., and Prather, D. W., "Radio frequency signal-generation system with over seven octaves of continuous tuning," Nat. Photon. 7, 118-122 (2013).

Li, J., Lee, H., and Vahala., K.J., "Microwave synthesizer using an on-chip Brillouin oscillator," Nat. Commun. 4, 2097 (2013).

Fortier, T., et al., "Generation of ultrastable microwaves via optical frequency division," Nat. Photon. 5, 425-429 (2011).

H. Murata, A. Morimoto, T. Kobayashi, and S. Yamamoto, "Optical Pulse Generation by Electrooptic-Modulation Method and Its Application to Integrated Ultrashort Pulse Generators," IEEE J. Sel. Top. Quantum Electron. 6, 1325 (2000).

M. Fujiwara, J. Kani, H. Suzuki, K. Araya, M. Teshima, "Flattened optical multicarrier generation of 12.5 GHz spaced 256 channels based on sinusoidal amplitude and phase hybrid modulation," IEEE Electron. Lett. 37, 967-968 (2001).

A. J. Metcalf, V. Torres-Company, D. E. Leaird, and A. M. Weiner, "High-power broadly tunable electro-optic frequency comb generator," IEEE J. Sel. Top. Quantum Electron. 19, 3500306 (2013).

A. Rolland, G. Loas, M. Brunel, L. Frein, M. Vallet, and M. Alouini, "Non-linear optoelectronic phase-locked loop for stabilization of opto-millimeter waves: towards a narrow linewidth tunable THz source," Opt. Express 19, 17944-17950 (2011).

William C. Swann, Esther Baumann, Fabrizio R. Giorgetta, and Nathan R. Newbury, "Microwave generation with low residual phase noise from a femtosecond fiber laser with an intracavity electro-optic modulator," Opt. Express 19, 24387-24395 (2011).

Papp, S. B., Beha, K., DelHaye, P., Quinlan, F., Lee, H., Vahala, K. J., Diddams, S. A., "A microresonator frequency comb optical clock," arXiv:1309.3525 (2013).

C. B. Huang, S. G. Park, D. E. Leaird, and A. M. Weiner, "Nonlinearly broadened phase-modulated continuous-wave laser frequency combs characterized using DPSK decoding," Opt. Express 16, 2520-2527 (2008).

I. Morohashi, T. Sakamoto, H. Sotobayashi, T. Kawanishi, and I. Hosako, "Broadband wavelength-tunable ultrashort pulse source using a Mach-Zehnder modulator and dispersion-flattened dispersion-decreasing fiber," Opt. Lett. 34, 2297-2299 (2009).

A. Ishizawa, T. Nishikawa, A. Mizutori, H. Takara, A. Takada, T. Sogawa, and M. Koga, "Phase-noise characteristics of a 25-GHz-spaced optical frequency comb based on a phase- and intensity-modulated laser," Opt. Express 21, 29186-29194 (2013).

S. Suzuki, K. Kashiwagi, Y. Tanaka, Y. Okuyama, T. Kotani, J. Nishikawa, H. Suto, M. Tamura, and T. Kurokawa, "12.5 GHz Near-IR Frequency Comb Generation Using Optical Pulse Synthesizer for Extra-Solar Planet Finder," in Nonlinear Optics, OSA Technical Digest: Nonlinear Optics Conference (Optical Society of America, 2013), paper NM3A.3.

Young, B., Cruz, F., Itano, W., and Bergquist, J., "Visible Lasers with Subhertz Linewidths," Phys. Rev. Lett. 82, 3799-3802 (1999).

T. Kessler, C. Hagemann, C. Grebing, T. Legero, U. Sterr, F. Riehle, M. J. Martin, L. Chen, and J. Ye., "A sub-40-mHz-linewidth laser based on a silicon single-crystal optical cavity," Nat. Photon. 6, 687-692 (2012).

Lee, H., Chen, T., Li, J., Yang, K. Y., Jeon, S., Painter, O., and Vahala, K. J., "Chemically etched ultrahigh-Q wedge resonator on a silicon chip," Nat. Photon. 6, 369-373 (2012).

Li, J., Lee, H., Chen, T., and Vahala, K. J., "Characterization of a high coherence, brillouin microcavity laser on silicon," Opt. Express 20, 20170-20180 (2012).

J. Li, H. Lee, K. Y. Yang, and K. J. Vahala, "Sideband spectroscopy and dispersion measurement in microcavities," Opt. Exp. 20, 26337-26344 (2012).

Dreyer, R., Hall, J. L., Kowalski, F., Hough, J., Ford, G., Munley, A., and Ward, H., "Laser phase and frequency stabilization using an optical resonator," Appl. Phys. B 31, 97-105 (1983).

Gross, M. C., Callahan, P. T., Clark, T. R., Novak, D., Waterhouse, R. B., and Dennis, M. L., "Tunable millimeter-wave frequency synthesis up to 100 GHz by dual-wavelength Brillouin fiber laser," Opt. Express 18, 13321-13330 (2010).

Callahan, P. T., Gross, M. C., and Dennis, M. L., "Frequency-independent phase noise in a dual-wavelength Brillouin fiber laser," IEEE J. Quantum Electron. 47, 1142-1150 (2011).

(56) References Cited

OTHER PUBLICATIONS

T. Sakamoto, T. Kawanishi, and M. Izutsu, "Asymptotic formalism for ultraflat optical frequency comb generation using a Mach-Zehnder modulator," Opt. Lett. 32, 1515-1517 (2007).
Dudley, J. M., Genty, G., Coen, Stephane, "Supercontinuum generation in photonic crystal fiber," Rev. Mod. Phys. 78, 1135-1184 (2006).
Li, J., Yi, X., Lee, H., Diddams, S., and Vahala, K., "Electro-optical frequency division and stable microwave synthesis," Science 345, 309-313 (2014).
Geng, J., Staines, S., and Jiang, S., "Dual-frequency Brillouin fiber laser for optical generation of tunable low-noise radio frequency/microwave frequency," Opt. Lett. 33, 16-18 (2008).
Pan, S., and Yao, J., "A wavelength-switchable single-longitudinal-mode dual-wavelength erbium-doped fiber laser for switchable microwave generation," Opt. Express 17, 5414-5419 (2009).
Taylor, J., Datta, S., Hati, A., Nelson, C., Quinlan, F., Joshi, A., and Diddams, S., "Characterization of Power-to-Phase Conversion in High-Speed P-I-N. Photodiodes," IEEE Photonics Journal 3, 140 (2011).
A. J. Seeds, K. J. Williams, J., Lightwave Technol. 24, 4628-4641 (2006).
J. Yao, J. Lightwave Technol. 27, 314-335 (2009).
G. Carpintero et al., Opt. Lett. 37, 3657-3659 (2012).
E. N. Ivanov, S. A. Diddams, L. Hollberg, IEEE Trans. Ultrason. Ferroelectr. Freq. Control 52, 1068-1074 (2005).
Jiang Li, Hansuek Lee, and Kerry J. Vahala; "Low-noise Brillouin laser on a chip at 1064 nm"; Optics Letters vol. 39 pp. 287-290 (2014).
S. P. Smith, F. Zarinetchi, and S. Ezekiel; "Narrow-linewidth stimulated Brillouin fiber laser and applications"; Opt. Lett. vol. 16 pp. 393-395 (1991).
J. Geng, Staines, S., Z. Wang, J. Zong, M. Blake, and S. Jiang; "Highly stable low-noise Brillouin fiber laser with ultranarrow spectral linewidth;" IEEE Photonics Technology Letters vol. 18 pp. 1813-1815 (2006).
A. Debut, S. Randoux, and J. Zemmouri; "Linewidth narrowing in Brillouin lasers: theoretical analysis"; Phys. Rev. A62 023803 (2000).
Y. G. Shee, M. A. Mandi, M. H. Al-Mansoori, S. Yaakob, R. Mohamed, A. K. Zamzuri, A. Man, A. Ismail, and S. Hitam; "All-optical generation of a 21 GHz microwave carrier by incorporating a double-Brillouin frequency shifter"; Opt. Lett. vol. 35 pp. 1461-1463 (2010).
Y. G. Shee, M. H. Al-Mansoori, S. Yaakob, A. Man, A. K. Zamzuri, F. R. Mahamd Adikan, and M. A. Mandi; "Millimeter wave carrier generation based on a double-Brillouin-frequency spaced fiber laser"; Opt. Express vol. 20 pp. 13402-13408 (2012).
Co-owned U.S. Appl. No. 14/605,977, filed Jan. 26, 2015.
Co-owned U.S. Appl. No. 14/605,987, filed Jan. 26, 2015.
Adar, R., et al., Less than 1 dB Per Meter Propagation Loss of Silica Waveguides Measured Using a Ring Resonator, J. Lightwave Tech. 1994, 12: 1369-1372.
Agrawal, G.P. "Mode-partition noise intensity correlation is a two-mode semiconductor laser" *Physical Review A* vol. 37, No. 7 (1988) pp. 2488-2494.
Alnis et al. "Thermal-noise limited laser stabilization to a crystalline whispering-gallery-mode resonator" arXiv:1102.4227v1 (Feb. 21, 2011).
Anetsberger, G., et al., Ultralow-dissipation optomechanical resonators on a chip, Nature Photonics 2008, 2: 627-633.
Aoki, T., et al., "Observation of strong coupling between one atom and a monolithic microresonator", Nature 2006, 443: 671-674.
Armani, D.K., et al. "Ultra-high-Q toroid microcavity on a chip." Nature, vol. 421, pp. 925-928, 2003.
Barwicz, T., et al., "Three-Dimensional Analysis of Scattering Losses Due to Sidewall Roughness in Microphotonic Waveguides", J. Lightwave Tech. 2005, 23: 2719-2732.
Bauters, J., et al. "Ultra-low-loss high-aspect-ratio Si3N4 waveguides", Optics Express 2011, 19: 3163-3164.
Black. "An introduction to Pound-Drever-Hall laser frequency stabilization" American Journal of Physics. vol. 69; No. 1; p. 79. (2001).
Braje, D., et al., "Brillouin-Enhanced Hyperparametric Generation of an Optical Frequency Comb in a Monolithic Highly Nonlinear Fiber Cavity Pumped by a cw Laser", Phys. Rev. Letters 2009, PRL 102: 193902-1-193902-4.
Cai, M., et al., "Observation of Critical Coupling in a Fiber Taper to a Silica-Microsphere Whispering-Gallery Mode System", Phys. Rev. Letters 2000, 85: 74-77.
Carmon, T., et al., "Dynamical thermal behavior and thermal self-stability of microcavities", Optics Express 2004, 12: 4742-4750.
Ciminelli, C., et al., "Photonic technologies for angular velocity sensing", Adv. Opt. & Photo. 2010, 2: 370-404.
Ciminelli, C., et al., "Three-dimensional modeling of scattering loss in InGaAsP/InP and silica-on-silicon bent waveguides", J. Europ. Opt. Society 2009, 4: 09015-1-09015-6.
Del'Haye, P., et al., "Frequency comb assisted diode laser spectroscopy for measurement of microcavity dispersion", Nature Photonics 2009, 3: 529-533.
Del'Haye, P., et al., "Full Stabilization of a Microresonator-Based Optical Frequency Comb", Phys. Rev. Letters 2008, PRL 101: 053903-1-053903-4.
Del'Haye, P., et al., "Octave Spanning Tunable Frequency Comb from a Microresontaor", Phys. Rev. Letters 2011, PRL 107: 063901-1-063901-4.
Del'Haye, P., et al., "Optical frequency comb generation from a monolithic microresonator", Nature 2007, 450: 1214-1218.
Drever et al. "Laser phase and frequency stabilization using an optical resonator" Applied Physics B 31(2) 97 (1983).
Ferdous, F., et al., "Spectral line-by-line pulse shaping of on-chip microresonator frequency combs", Nature Photonics 2011, 5: 770-776.
Foster, M., et al., "Silicon-based monolithic optical frequency comb source", Optics Express 2011, 19: 14233-14239.
Geng, J. et al. "Narrow Linewidth Fiber Laser for 100-km Optical Frequency Domain Reflectometry," IEEE Photon. Technol. Lett. 17, 1827-1929, 2005.
Gorodetsky, M., et al., "Fundamental thermal fluctuations in microspheres", J. Opt. Soc. Am. B 2004, 21: 697-705.
Gorodetsky, M.L., et al. "Ultimate Q of optical microsphere resonators." Optics Letters, vol. 21, No. 7, pp. 453-455, 1996.
Grudinin, I., et al., "Brillouin Lasing with a CaF2 Whispering Gallery Mode Resonator", Phys. Rev. Letters 2009, PRL 102: 043902-1-043902-4.
Grudinin, I., et al., "Generation of optical frequency combs with a CaF2 resonator", Optics Letters 2009, 34: 878-880.
Grudinin, I., et al., "On the fundamental limits of Q factor of crystalline dielectric resonators", Optics Express 2007, 15: 3390-3395.
Grudinin, I., et al., "Ultrahigh optical Q factors of crystalline resonators in the linear regime", Phys. Rev. Letters A 2006, 74: 063806-1-063806-9.
Hansch, T.W., et al., Laser Frequency Stabilization by Polarization Spectroscopy of a Reflecting Reference Cavity, Optics Comm. 1980, 35: 441-444.
Hossein-Zadeh, M. and Vahala, K.J. "Importance of Intrinsic-Q in Microring-Based Optical Filters and Dispersion-Compensation Devices." Photonics Technology Letters, vol. 19, Issue 14, pp. 1045-1047, 2007.
Illchenko, V.S., et al., Optical Resonators with Whispering-Gallery Modes—Part II: Applications, IEEE J. Selected Topics in Quna. Elec. 2006, 12: 15-32.
Ip, E., et al., Coherent detection in optical fiber systems, Optics Express 2008, 16: 753-821.
Johnson, A., et al., Chip-based frequency combs with sub-100 GHz repetition, Optics Letters 2012, 37: 875-877.
Karlsson, C., et al., All-fiber multifunction continuous-wave coherent laser radar at 1.55 μm for range, speed, vibration, and wind measurements, Applied Optics 2000, 39: 3716-31726.

(56) References Cited

OTHER PUBLICATIONS

Kasai, K., et al., 256-QAM (64 Gb/s) Coherent Optical Transmission Over 160 km With an Optical Bandwidth of 5.4 GHz, IEEE Phon. Tech. Letters 2010, 22: 185-187.
Kippenberg, T.J, et al., Cavity Opto-Mechanics, Optics Express 2007, 15: 17172-17205.
Kippenberg, T.J, et al., Cavity Optomechanics: Back-Action at Mesoscale, Science 2008, 321: 1172-1176.
Kippenberg, T.J, et al., Microresonator-Based Optical Frequency Combs, Science 2011, 332: 555-559.
Kippenberg, T.J. et al. "Fabrication and coupling to planar high-Q silica disk microcavities," Applied Physics Letters, vol. 83(4), pp. 797-799, 2003.
Kippenberg, T.J., et al., Demonstration of an erbium-doped microdisk laser on a silicon chip, Phys. Rev. A 2006, 74: 051802(R)-1-051802(R).
Kippenberg, T.J., et al., Kerr-Nonlinearity Optical Parametric Oscillation in an Ultrahigh-$Q$ Toroid Microcavity, Phys. Rev. Letters 2004, 93: 083904-1-083904-4.
Kohtoku, M., et al. "New Waveguide Fabrication Techniques for Next-generation PLCs." NTT Technical Review, vol. 3, No. 7, pp. 37-41, 2005.
Kominato, Extremely Low-loss (0.3 dB/m) and Long Silica-Based Waveguides with Large Widtth and Clothoid Curve Connection, ECOC Proceedings 2004, 2: pp. 1-2.
Lee, H. et al. "Ultra-Low-Loss Optical Delay Line on a Silicon Chip." 7 pgs. Mar. 20, 2012.
Lee, H., et al., Chemically etched ultrahigh-Q wedge-resonator on a silicon chip, Nature Photonics 2012, 6: 369-373.
Lee, H., et al., Ultra-high-Q wedge-resonator on a silicon chip, arXiv: 1112.2196v1 2011, pp. 1-5.
Levy, J., et al., CMOS-compatible multiple-wavelength oscillator for on-chip optical interconnects, Nature Photonics 2009, 4: 37-40.
Li, J. et al. "Chip-Based Frequency Combs with Microwave Repetition Rate." 6 pgs. Mar. 28, 2012.
Li, J., et al., Characterization of a high coherence, Brillouin microcavity laser on silicon, Optics Express 2012, 20: pp. 1-11.
Li, J., et al., Chip-based Brillouin lasers as spectral purifiers for photonic systems, arXiv:1201.4212 2011, pp. 1-5.
Li, J., et al., Highly Coherent, Microcavity Brillouin Laser on Silicon, FIO/LS Tech. Digest 2011, pp. 1-2.
Li, J., et al., Low-Pump-Power, Low-Phase-Noise, and Microwave to Millimeter-Wave Repetition Rate Operation in Microcombs, Physical Review Letters 2012, 109: 233901-1-233901-5.
Lu, T., et al., Frequency Noise of a Microchip Raman Laser, CLEO 2009, pp. 1-2.
Lu., T., et al., High sensitivity nanoparticle detection using optical microcavities, PNAS 2011, 108: 5976-5979.
Lytollis J., et al. "Infra-red optical communication systems." Infrared Physics, vol. 8, Issue 1, pp. 123-129; 1968.
Matsko, A., et al., Optical Resonators with Whispering Gallery-Gallery Modes—Part I: Basics, IEEE J. Selected Topics in Quna. Elec. 2006, 12: 3-14.
Matsko, A., et al., Whispering-gallery-mode resonators as frequency references. I. Fundamental limitations, J. Opt. Soc. Am. B 2007, 24: 1324-1335.
Okai, M., et a., Strained multiquantum-well corrugation-pitch-modulated distributed feedback laser with ultranarrow (3.6 kHz) spectral linewidth, Elec. Letters 1993, 29: 1696-+.
Okawachi, Y., et al., Octave-spanning frequency comb generation in a silicon nitride chip, Optics Letters 2011, 36: 3398-3400.
Okawachi, Y., et al., Tunable All-Optical Delays via Brillouin Slow Light in an Optical Fiber, Phys. Rev. Letters 2005, PRL 94: 153902-1-153902-4.
Pant, R., et al., Cavity enhanced stimulated Briollouin scattering in an optical chip for multiorder Stokes generation, Optics Letters 2011, 36: 3687-3689.
Papp, S.B. et al. "Spectral and temporal characterization of a fused-quartz-microresonator optical frequency comb" *Physical Review A*, vol. 84, pp. 053833-1-053833-7 (2011).

Payne, S., et al., A theoretical analysis of scattering loss from planar optical waveguides, Opt. and Quan. Elec. 1994, 26: 977-986.
Poulsen, M.R. et al., "Advances in silica-based integrated optics." Opt. Eng., vol. 42, 2821-2834, Oct. 2003.
Quinlan, F., et al., A 12.5 GHz-spaced optical frequency comb spanning >400 nm for near-infrared astronomical spectrograph calibration, Rev. Sci. Instr. 2010, 81: 063105-1-063105-9.
Rafac, R.J., et al., Sub-dekahertz Ultraviolet Spectroscopy of 199 Hg+, Phys. Rev. Letters 2000, 85: 2462-2465.
Razzari, L., et al., CMOS-compatible integrated optical hyper-parametric oscillator, Nat. Phon. 2009, 4:41-45.
Savchenkov, A., et al., Low Threshold Optical Oscillations in a Whispering Gallery Mode CaF2 Resonator, Phys. Rev. Letters 2004, PRL 93: 243905-1-243905-4.
Savchenkov, A., et al., Optical resonators with ten million finesse, Optics Express 2007, 15: 6768-6773.
Savchenkov, A., et al., Tunable Optical Frequency Comb with a Crystalline Whispering Gallery Mode Resonator, Phys. Rev. Letters 2008, PRL 101: 093902-1-093902-4.
Savchenkov, A., et al., Whispering-gallery-mode resonators as frequency references. II. Stabilization, J. Opt. Soc. Am. B 2007, 24: 2988-2997.
Savory, S., et al., Laser Linewidth Requirements for Optical DQPSK Systems, IEEE Photo. Tech. Letters 2004, 16: 930-932.
Schawlow, A.L., et al., Infrared and Optical Masers, Phys. Rev. 1958, 112: 1940-1949.
Schliesser, A., et al., Resolved-sideband cooling of a micromechanical oscillator, Nature Physics 2008, 4: 415-419.
Shi, J.W., et al., High-Speed, High-Responsivity, and High-Power Performance of Near-Ballistic Uni-Traveling-Carrier Photodiode at 1.55 μm Wavelength, IEEE Photo. Tech. Letters 2005, 17: 1929-1931.
Spillane, S.M., et al., Ideality in a Fiber-Taper-Coupled Microresonator System for Application to Cavity Quantum Electrodynamics, Phys. Rev. Letters 2003, 91: 043902-1-043902-4.
Spillane, S.M., et al., Ultralow-threshold Raman laser using a spherical dielectric microcavity, Nature 2002, 415: 621-623.
Syms, R.R.A. et al., "Reflow and Burial of Channel Waveguides Formed in Sol-Gel Glass on Si Substrates." IEEE Photonics Technology Letters, vol. 5, No. 9, 1077-1079, Sep. 1993.
Tien, M.C., et al., Ultra-high quality factor planar Si3N4 ring resonators on Si substrates, Optics Express 2011, 19: 13551-13556.
Tkach, RW, et al., Spontaneous Brillouin Scattering for Single-Mode Optical-Fibre Characterisation, Elec. Letters 1986, 22: 1011-1013.
Tomes, M., et al., Photonic Micro-Electromechanical Systems Vibrating at X-band (11-GHz) Rates, Phys. Rev. Letters 2009, PRL 102: 113601-1-113601-4.
Udem, Th., et al., Optical frequency metrology, Nature 2002, 416: 233-237.
Vahala, K., et al., Semiclassical Theory of Noise in Semiconductor Lasers—Part I, IEEE J. Quan. Elec. 1983, QE-19: 1096-1101.
Vahala, K.J. Optical microcavities, Nature, vol. 424, No. 6950, pp. 839-846, 2003.
Veroony, D.W., et al., High-$Q$ measurements of fused-silica microspheres in the near infrared, Optics Express 1998, 23: 247-249.
Vollmer, F., et al., Whispering-gallery-mode biosensing: label-free detection down to single molecules, Nature Methods 2008, 5: 591-596.
Xu et al. "Archimedean spiral cavity ring resonators in silicon as ultra-compact optical comb filters" Optics Express. vol. 18; No. 3; pp. 1937-1945. 2010.
Xu et al. "Folded cavity SOI microring sensors for high sensitivity and real time measurment of biomolecular binding" Optics Express. 16, 15137 (2008).
Yang, L., et al., A 4-Hz Fundamental Linewidth on-chip Microlaser, CLEO 2007, pp. 1-2.
Young, B.C., et al., Visible Lasers with Subhertz Linewidths, Phys. Rev. Letters 1999, 82: 3799-3802.
Zhu, Z., et al., Broadband SBS Slow Light in an Optical Fiber, J. Lightwave Tech. 2007, 25: 201-206.

(56) References Cited

OTHER PUBLICATIONS

Zhu, Z., et al., Stored Light in an Optical Fiber via Stimulated Brillouin Scattering, Science 2007, 318: 1748-1750.
International Search Report and Written Opinion for International Application PCT/US2013/032717. Mail Date: Jul. 26, 2013.
International Search Report and Written Opinion for International Application PCT/US2015/012962. Mail Date: Nov. 12, 2015.
International Search Report and Written Opinion for International Application PCT/US2015/012964. Mail Date: Nov. 12, 2015.
International Search Report and Written Opinion for International Application PCT/US2015/019080. Mail Date: Dec. 29, 2015.
International Preliminary Report on Patentability for International Application PCT/US2013/032717. Mail Date: Dec. 9, 2014.
Ex Parte Quayle Action mailed on Jul. 7, 2014 for U.S. Appl. No. 13/525,189, filed Jun. 15, 2012 in the name of Jiang Li et al.
Non-Final Office Action issued for U.S. Appl. No. 12/436,935, filed May 7, 2009 in the name of Andrea Martin Armani mail date: May 3, 2011.
Notice of Allowance mailed on Nov. 25, 2011 for U.S. Appl. No. 13/033,391, filed Feb. 23, 2011 in the name of Andrea Martin Armani et al.
Non-Final Office Action mailed on Sep. 1, 2011 for U.S. Appl. No. 13/033,391, filed Feb. 23, 2011 in the name of Andrea Martin Armani et al.
Notice of Allowance issued for U.S. Appl. No. 12/436,935, filed May 7, 2009 in the name of Andrea Martin Armani mail date: Jul. 26, 2011.
Notice of Allowance mailed on Jan. 30, 2015 for U.S. Appl. No. 14/513,058, filed Oct. 13, 2014 in the name of California Institute of Technology.
Notice of Allowance mailed on Jun. 16, 2014 for U.S. Appl. No. 13/494,707, filed Jun. 12, 2012 in the name of Kerry Vahala et al.
Notice of Allowance mailed on Sep. 8, 2014 for U.S. Appl. No. 13/525,189, filed Jun. 15, 2012 in the name of Jiang Li et al.
Restriction Requirement issued for U.S. Appl. No. 12/436,935, filed May 7, 2009 in the name of Andrea Martin Armani mail date: Dec. 29, 2010.
Restriction Requirement mailed on Aug. 15, 2014 for U.S. Appl. No. 13/525,147, filed Jun. 15, 2012 in the name of Jiang Li et al.
Restriction Requirement mailed on Dec. 29, 2010 for U.S. Appl. No. 12/436,935, filed May 7, 2009 in the name of Andrea Martin Armani et al.
Restriction Requirement mailed on May 31, 2014 for U.S. Appl. No. 13/525,189, filed Jun. 15, 2012 in the name of Jiang Li et al.

* cited by examiner

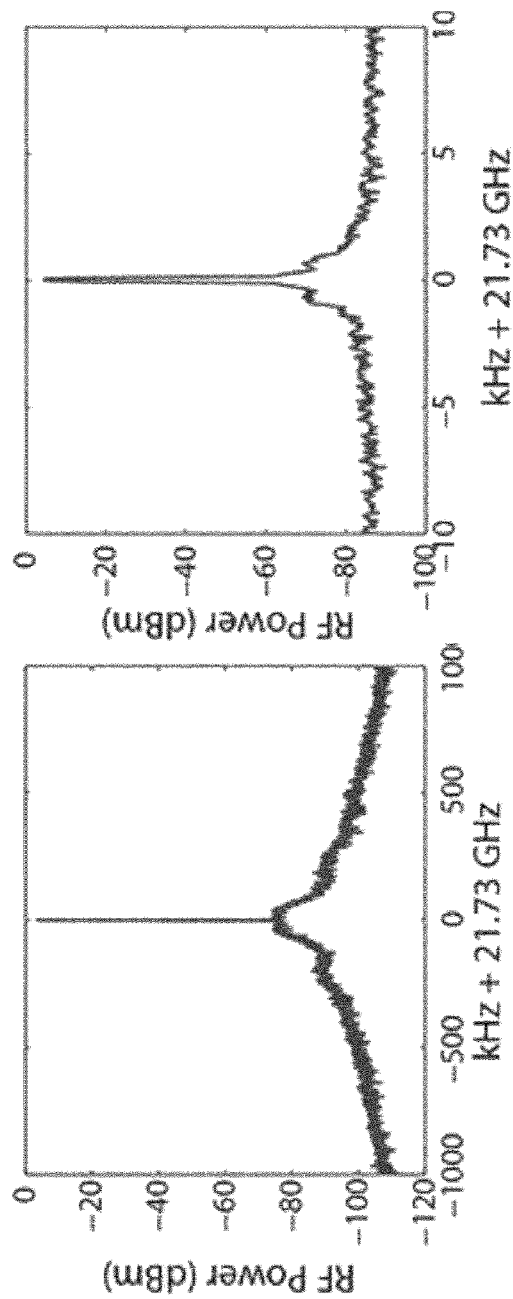
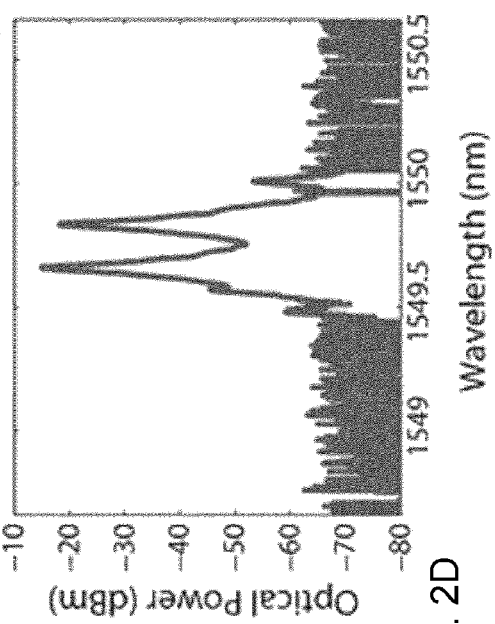
FIG. 2A
FIG. 2B
FIG. 2D

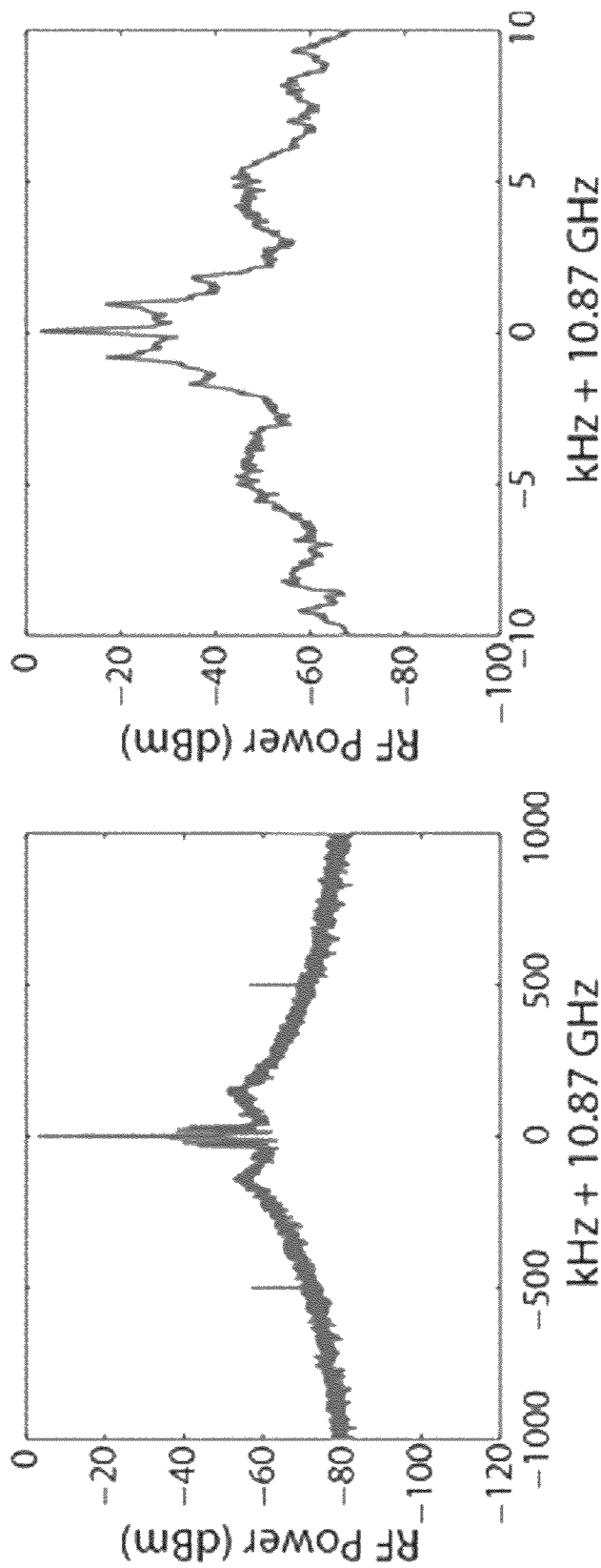

STABLE MICROWAVE-FREQUENCY SOURCE BASED ON CASCADED BRILLOUIN LASERS

BENEFIT CLAIMS TO RELATED APPLICATIONS

This application claims benefit of U.S. provisional App. No. 61/949,129 entitled "High Performance Brillouin Microwave Oscillator" filed Mar. 6, 2014 in the names of Jiang Li and Kerry Vahala, said provisional application being hereby incorporated by reference as if fully set forth herein.

STATEMENT REGARDING FEDERALLY SPONSORED RESEARCH

This invention was made with government support under FA9550-10-1-0284 awarded by the Air Force and under PHY-1125565 awarded by the National Science Foundation. The government has certain rights in the invention.

FIELD OF THE INVENTION

The field of the present invention relates to generating microwave-frequency electrical signals and microwave-frequency sources utilizing cascaded Brillouin laser oscillation in a single optical resonator pumped by a single pump laser. In particular, apparatus and methods are described herein for generating microwave-frequency electrical signals exhibiting exceptional high frequency stability and low phase noise using two distinct Brillouin laser frequencies from the single optical resonator pumped by the single pump laser.

BACKGROUND

Subject matter disclosed or claimed herein may be related to subject matter disclosed in:

Seeds, A. J. and Williams, K. J.; "Microwave photonics"; IEEE J. Lightwave Technol. Vol 24 pp 4628-4641 (2006);
Yao, J.; "Microwave Photonics"; IEEE J. Lightwave Technol. Vol 27 pp 314-335 (2009);
Pillet, G., Morvan, L., Brunel, M., Bretenaker, F., Dolfi, D., Vallet, M., Huignard, J.-P., and Le Floch, A.; "Dual-frequency laser at 1.5 μm for optical distribution and generation of high-purity microwave signals"; J. Lightw. Technol. Vol 26 pp 2764-2773 (2008);
Geng, J., Staines, S., and Jiang, S.; "Dual-frequency Brillouin fiber laser for optical generation of tunable low-noise radio frequency/microwave frequency"; Opt. Lett. Vol 33 pp 16-18 (2008);
Pan, S., and Yao, J.; "A wavelength-switchable single-longitudinal-mode dual-wavelength erbium-doped fiber laser for switchable microwave generation"; Opt. Express Vol 17 pp 5414-5419 (2009);
Gross, M. C., Callahan, P. T., Clark, T. R., Novak, D., Waterhouse, R. B., and Dennis, M. L.; "Tunable millimeter-wave frequency synthesis up to 100 GHz by dual-wavelength brillouin fiber laser"; Opt. Express Vol 18 pp 13321-13330 (2010);
Callahan, P. T., Gross, M. C., and Dennis, M. L.; "Frequency-independent phase noise in a dual-wavelength brillouin fiber laser"; IEEE J. Quantum Electron. Vol 47 pp 1142-1150 (2011);
S. P. Smith, F. Zarinetchi, and S. Ezekiel; "Narrow-linewidth stimulated Brillouin fiber laser and applications"; Opt. Lett. Vol 16 pp 393-395 (1991);
J. Geng, Staines, S., Z. Wang, J. Zong, M. Blake, and S. Jiang; "Highly stable low-noise Brillouin fiber laser with ultranarrow spectral linewidth;" IEEE Photonics Technology Letters Vol 18 pp 1813-1815 (2006);
A. Debut, S. Randoux, and J. Zemmouri; "Linewidth narrowing in Brillouin lasers: theoretical analysis"; Phys. Rev. A62 023803 (2000);
Lee, H., Chen, T., Li, J., Yang, K. Y., Jeon, S., Painter, O., and Vahala, K. J.; "Chemically etched ultrahigh-Q wedge resonator on a silicon chip"; Nat. Photon. Vol 6 pp 369-373 (2012);
Li, J., Lee, H., Chen, T., and Vahala, K. J.; "Characterization of a high coherence, brillouin microcavity laser on silicon"; Opt. Express Vol 20 pp 20170-20180 (2012);
Jiang Li, Hansuek Lee, and Kerry J. Vahala; "Low-noise Brillouin laser on a chip at 1064 nm"; Optics Letters Vol 39 pp 287-290 (2014);
U.S. Pat. No. 7,142,570 entitled "Apparatus and method for generating optical carrier for microwave and millimeter-wave photonics system" issued Nov. 28, 2006 to S-S Lee, H Park, H Cho, S-K Lim, and J-S Ko;
Y. G. Shee, M. A. Mandi, M. H. Al-Mansoori, S. Yaakob, R. Mohamed, A. K. Zamzuri, A. Man, A. Ismail, and S. Hitam; "All-optical generation of a 21 GHz microwave carrier by incorporating a double-Brillouin frequency shifter"; Opt. Lett. Vol 35 pp 1461-1463 (2010);
Y. G. Shee, M. H. Al-Mansoori, S. Yaakob, A. Man, A. K. Zamzuri, F. R. Mahamd Adikan, and M. A. Mandi; "Millimeter wave carrier generation based on a double-Brillouin-frequency spaced fiber laser"; Opt. Express Vol 20 pp 13402-13408 (2012);
U.S. Pre-Grant Pub. No. US 2013/0010819 entitled "All-optical generation of 60 GHz millimeter wave using multiple wavelength Brillouin-erbium fiber laser" published Jan. 10, 2013 in the names of A. Ahmad, et. al.;
Drever, R., Hall, J. L., Kowalski, F., Hough, J., Ford, G., Munley, A., and Ward, H.; "Laser phase and frequency stabilization using an optical resonator"; Appl. Phys. B Vol 31 pp 97-105 (1983); and
Li, J., Lee, H., and Vahala., K. J.; "Microwave synthesizer using an on-chip Brillouin oscillator"; Nat. Commun. Vol 4 p 2097 (2013).

Each of the references listed above is incorporated by reference as if fully set forth herein.

SUMMARY

A microwave-frequency source, generating an output electrical signal at an output frequency $f_M$, comprises a pump laser source, an optical resonator, and a photodetector. Free spectral range $v_{FSR}$ of the optical resonator equals an integer submultiple of a Brillouin shift frequency $v_B$ of the optical resonator (i.e., $v_B = Mv_{FSR}$). The pump laser source is frequency-locked to a corresponding resonant optical mode of the optical resonator. Pumping the optical resonator with output of the pump laser source at a pump frequency $v_{pump}$ results in stimulated Brillouin laser oscillation in the optical resonator at respective first, second, and third Stokes Brillouin-shifted frequencies $v_1 = v_{pump} - v_B$, $v_2 = v_{pump} - 2v_B$, and $v_3 = v_{pump} - 3v_B$. The photodetector receives stimulated Brillouin laser outputs at the first and third Stokes Brillouin-shifted frequencies $v_1$ and $v_3$ and generates therefrom the output electrical signal at a beat frequency $f_M = v_1 - v_3 = 2v_B$.

A method for generating a microwave-frequency output electrical signal, using the microwave microwave-frequency source, comprises: (a) using the pump laser source, pumping the optical resonator so as to generate the stimulated Brillouin laser oscillation at the first, second, and third Stokes Brillouin-shifted frequencies; and (b) directing the stimulated Brillouin laser outputs at the first and third Stokes Brillouin-shifted frequencies onto the photodetector so as to generate the microwave-frequency output electrical signal at the frequency $f_M=2v_B$.

Objects and advantages pertaining to microwave-frequency sources may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 2A through 2F are plots characterizing performance of an example of an inventive microwave-frequency source arranged and operated according to the present disclosure.

Figure 1:
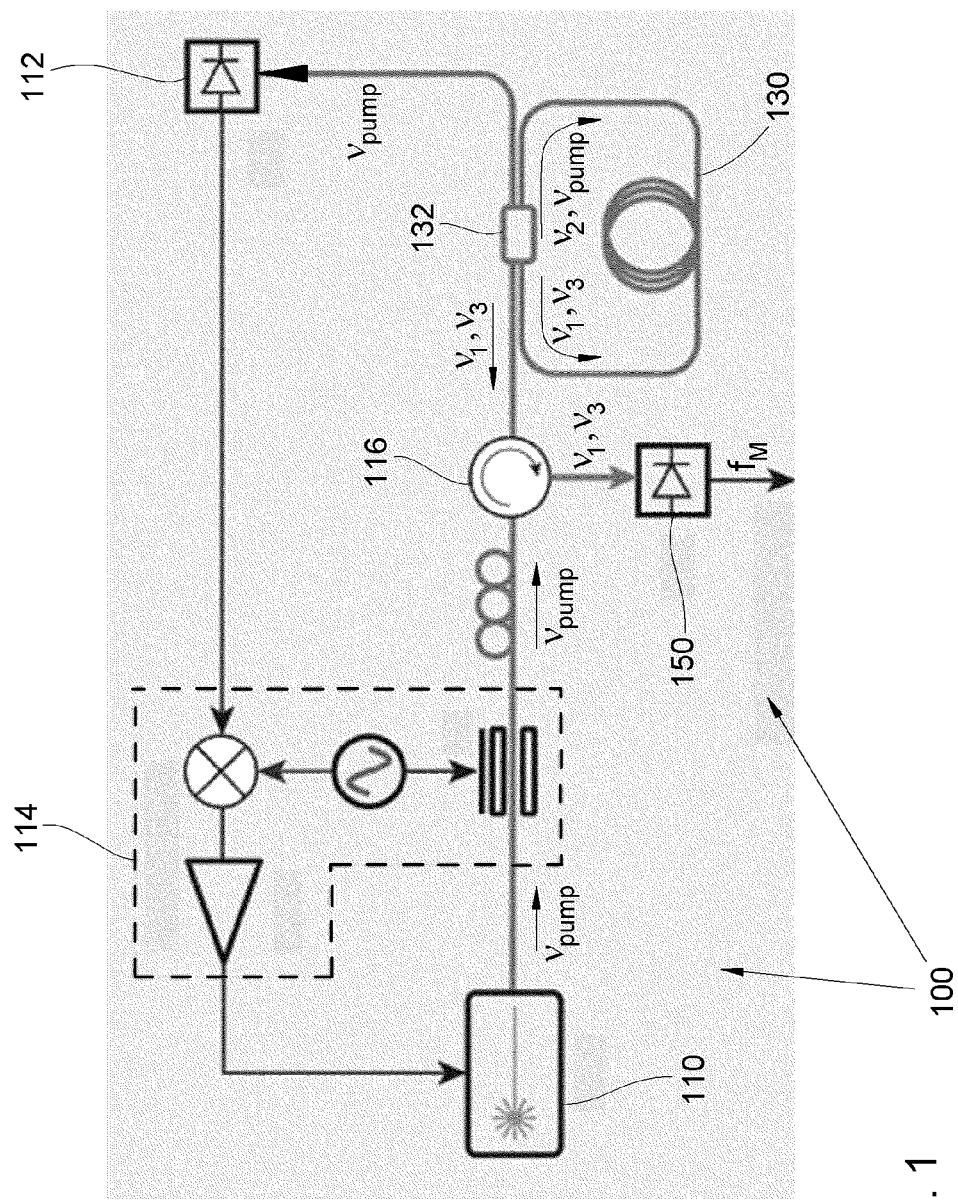
FIG. 1 illustrates schematically an example of an inventive microwave-frequency source arranged according to the present disclosure.

The embodiments depicted are shown only schematically: all features may not be shown in full detail or in proper proportion, certain features or structures may be exaggerated relative to others for clarity, and the drawings should not be regarded as being to scale. The embodiments shown are only examples: they should not be construed as limiting the scope of the present disclosure or appended claims.

DETAILED DESCRIPTION OF EMBODIMENTS

Stimulated Brillouin lasers have been demonstrated in fiber-based cavities and in chip-based high-Q microcavities. Dual pumping of such cavities has been used to generate narrow linewidth (low phase noise) microwave-frequency electrical reference signals by pumping two independently tunable Brillouin lasers from the same cavity and beating them against one another on a photodetector. To reduce the cost and complexity of such a microwave generator, a single-pump laser scheme has been developed to generate a microwave-frequency signal by beating the pump laser with the stimulated Brillouin laser output. However, the generated microwave-frequency signal using a conventional single-pump scheme exhibits a relatively broad frequency linewidth, e.g., a 3 dB linewidth of about 5 to 10 MHz. It would be desirable to provide a simple, stable, robust, and inexpensive single-pump Brillouin laser system for generating microwave-frequency signals with much smaller linewidth and low phase noise.

The inventive microwave-frequency source 100 disclosed herein substantially achieves those goals. Cascaded stimulated Brillouin laser oscillation is employed using a single-pump scheme. The generated microwave-frequency electrical signal has an effective 3 dB linewidth that is less than about 1 Hz, at least 6 orders of magnitude narrower than linewidths achieved using conventional single-pump systems. This is achieved by beating against one another on a fast photodetector 150 the first and third Stokes Brillouin-shifted laser outputs from a single optical resonator cavity 130 pumped by a single pump laser 110. Stimulated Brillouin laser oscillation is limited to a single longitudinal mode for each Brillouin-shifter laser frequency during the cascaded Brillouin lasing process. Virtually all of the technical noise in the system (e.g., from the pump laser 110, the optical resonator 130, and the optical path to the photodetector 150) is cancelled out upon beating the first and third Stokes laser signals against one another on the photodetector 150 to generate the beat frequency. The phase noise of the generated microwave-frequency signal exhibits a $1/f^2$ dependence, starting from a 3 Hz offset, that is characteristic of the fundamental Schawlow-Townes noise of the lasers. The inventive microwave-frequency source does not require any phase modulation or phase-locked loop (other than standard elements required for conventional frequency-locked operation of the pump laser) and does not require an RF reference oscillator.

An inventive microwave-frequency source 100 for generating an output electrical signal at an output frequency $f_M$, is illustrated schematically in FIG. 1 and comprises a pump laser source 110, an optical resonator 130, and a photodetector 150. The free spectral range $v_{FSR}$ of the optical resonator 130 is substantially equal to an integer submultiple of a Brillouin shift frequency $v_B$ of the optical resonator, i.e., $v_B=Mv_{FSR}$ where M is an integer. The pump laser source 110 is frequency-locked to a corresponding resonant optical mode of the optical resonator 130. The pump laser source 110 and the optical resonator 130 are arranged so that pumping the optical resonator with output of the pump laser source at a pump frequency $v_{pump}$ results in stimulated Brillouin laser oscillation in the optical resonator 130 at respective first, second, and third Stokes Brillouin-shifted frequencies $v_1=v_{pump}-v_B$, $v_2=v_{pump}-2v_B$, and $v_3=v_{pump}-3v_B$. The photodetector 150 is arranged to receive stimulated Brillouin laser outputs at the first and third Stokes Brillouin-shifted frequencies $v_1$ and $v_3$ and to generate therefrom the output electrical signal at a beat frequency $f_M=v_1-v_3=2v_B$.

In some examples on the microwave-frequency source 100, an external cavity diode laser is employed as the pump laser source 110; in other examples, a fiber laser is employed. Any suitable laser source can be employed as the pump laser source 110. In some examples of the microwave-frequency source 100, the pump laser source 110 is frequency-locked to the corresponding resonant optical mode of the optical resonator 130 using a Pound-Drever-Hall locking scheme. A portion of the pump laser output is directed onto a photodetector 112, the resulting electrical signal is coupled to a Pound-Drever-Hall mechanism 114, which in turn locks the pump frequency $v_{pump}$ to a resonant optical mode of the resonator 130. Any suitable locking mechanism can be employed, e.g., a Hänsch-Couillaud mechanism.

An optical coupler 132 (e.g., a 90/10 fiber directional coupler in the case of a fiber optical resonator 130) couples pump laser power into the optical resonator 130 and couples stimulated Brillouin laser output out of the optical resonator 130. Stimulated Brillouin laser oscillation in the optical resonator 130 is enabled by matching the free spectral range of the resonator 130 to an integer submultiple of its Brillouin shift frequency $v_B$. Resonant build-up of optical power in the resonator at the pump frequency $v_{pump}$ of the optical resonator eventually reaches a threshold for stimulated Brillouin laser oscillation at the first Stokes Brillouin-shifted frequency $v_1=v_{pump}-v_B$. Further increasing the pump power eventually causes the power of the first Stokes oscillation to reach a threshold for stimulated Brillouin laser oscillation at the second Stokes Brillouin-shifted frequency $v_2 = v_{pump} - 2v_B$, and increasing the pump power still further eventually causes the power of the second Stokes oscillation to reach a threshold for stimulated Brillouin laser oscillation at the third Stokes Brillouin-shifted frequency $v_3 = v_{pump} - 3v_B$.

Continued increase in the pump power can lead to stimulated Brillouin laser oscillation at still higher-order Stokes Brillouin-shifted frequencies, which is generally undesirable for stable operation of the inventive microwave-frequency source 100. In some examples, power at the pump laser frequency is maintained at a level above the threshold for stimulated Brillouin laser oscillation at the third Stokes Brillouin-shifted frequency $v_3$ but below the threshold for stimulated Brillouin laser oscillation at the fourth Stokes Brillouin-shifted frequency $v_4 = v_{pump} - 4v_B$. In other examples, the optical resonator can be structurally arranged so as to suppress stimulated Brillouin laser oscillation at a fourth Stokes Brillouin-shifted frequency $v_4 = v_{pump} - 4v_B$, thereby enabling use of higher pump power resulting in higher laser output power at the third Stokes Brillouin-shifter frequency $v_3$. In a fiber optical resonator, for example (see below), a fiber Bragg grating can be employed that introduces optical loss at $v_4$ and thereby suppress laser oscillation at that frequency. Whether or not such structural arrangements are employed, pump power can also be limited by onset of multimode laser oscillation (i.e., more than one resonant cavity mode supporting laser oscillation within the stimulated Brillouin gain bandwidth) at any of the first, second, or third Stokes Brillouin-shifted frequencies. Such multimode oscillation introduces undesirable or unacceptable sources of noise into the microwave-frequency source 100, not only because it introduces additional, spurious beat notes into the output electrical signal, but also because mode competition and nonlinear optical mixing in the fiber-loop resonator greatly increase the bandwidth of the output electrical signal. It is therefore desirable to limit output power of the pump laser source 110 so as to suppress multimode stimulated Brillouin laser oscillation in the optical resonator 130.

In many examples of the inventive microwave-frequency source 100, the optical resonator comprises silica and the Brillouin shift frequency $v_B$ of the optical resonator is about 10.87 GHz and a corresponding output frequency $f_M$ of about 21.73 GHz. Other suitable materials having other corresponding Brillouin shift frequencies can be employed. In some examples the optical resonator 130 comprises a ring optical resonator, such as a silica microdisk resonator. In other examples the optical resonator 130 comprises a fiber resonator, typically incorporating silica optical fiber; the fiber resonator can be arranged, e.g., as a Fabry-Perot optical resonator or as a fiber-loop resonator. In examples incorporating a fiber optical resonator, the fiber optical resonator include, depending on the desired free spectral range, an optical fiber greater than or equal to about 20 meters long, greater than or equal to about 40 meters long, greater than or equal to about 100 meters long, greater than or equal to about 200 meters long, or greater than or equal to about 500 meters long.

In examples wherein the optical resonator 130 is a ring or fiber-loop resonator the pump laser source 110 and the ring or fiber-loop optical resonator 130 can be arranged so that pumping the ring or fiber-loop optical resonator 130 results in (i) backward-propagating stimulated Brillouin laser oscillation in the ring optical resonator at the respective first and third Stokes Brillouin-shifted frequencies $v_1$ and $v_3$ and (ii) forward-propagating stimulated Brillouin laser oscillation in the ring optical resonator at the second Stokes Brillouin-shifted frequency $v_2$. In such examples, an optical circulator 116 can be employed to separate the backward-propagating stimulated Brillouin laser outputs at $v_1$ and $v_3$ from the forward-propagating pump laser power.

The first and third Stokes stimulated Brillouin laser outputs co-propagate along a common optical path from the optical resonator to the photodetector 150. Linear superposition of those two optical signals results in a signal incident on the photodetector 150 that produces an optical detector output electrical signal at a beat note frequency $f_M = v_1 - v_3 = 2v_B$. It is this microwave-frequency output electrical signal that is the output of the microwave-frequency source 100. The microwave-frequency output signal exhibits exceptionally low phase noise. Because both of the laser signals at $v_1$ and $v_3$ are derived from a common optical resonator 130 pumped by a common pump laser 110 and co-propagate to the photodetector 150 along a common optical path, nearly all sources of technical noise are cancelled out upon generation of the beat note signal at the photodetector 150. The primary source of remaining noise is the fundamental Schawlow-Townes noise inherent in any laser oscillator.

Figure 2C:
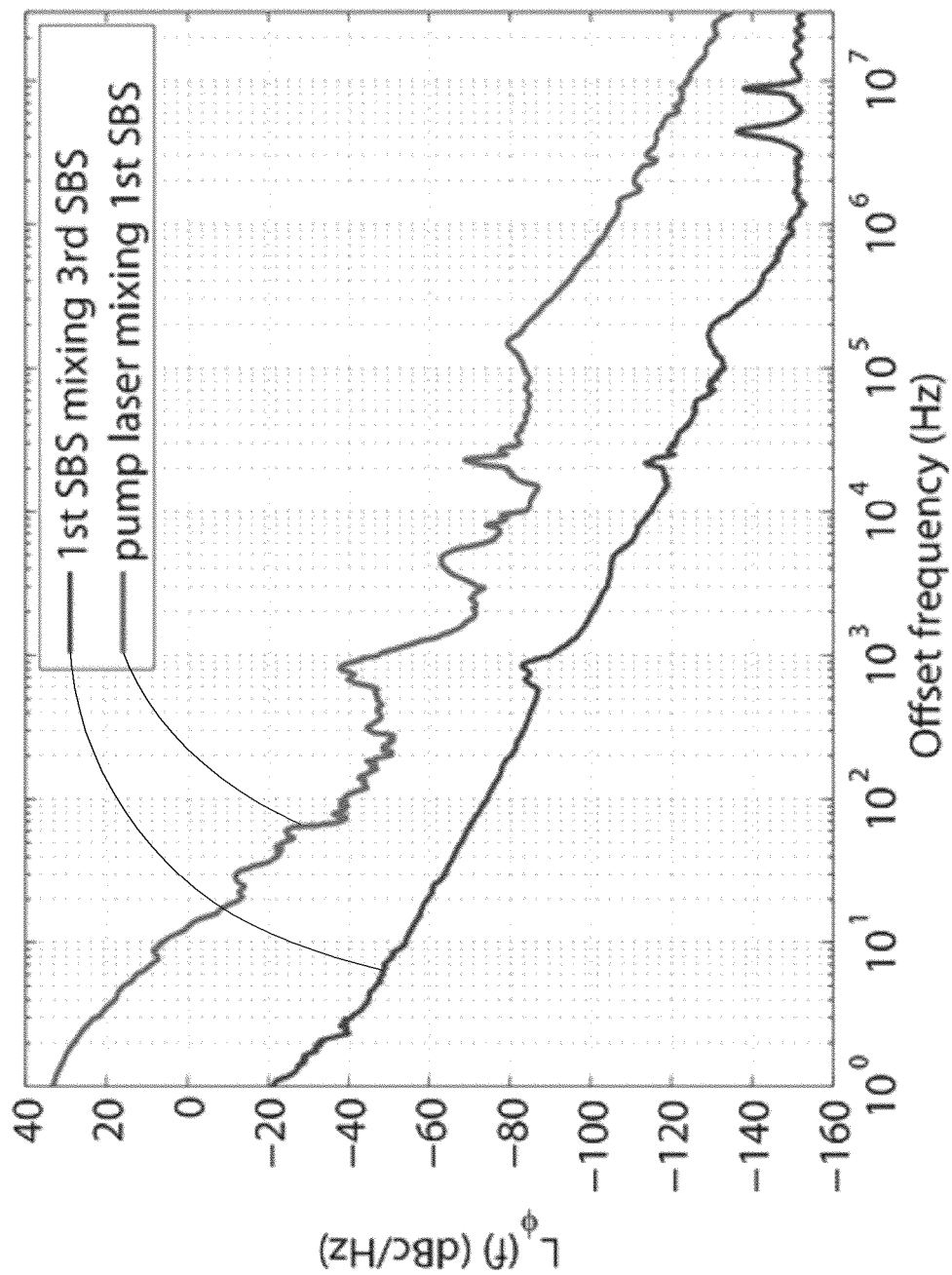

FIGS. 2A-2F illustrate the performance of an example of an inventive microwave-frequency source 100. In this example a fiber-loop resonator 130 comprises a 45 meter length of single-mode optical fiber ($v_B$ about 10.87 GHz) and a 90/10 fiber directional coupler 132 and exhibits a free spectral range of about 4.4 MHz. The pump laser source 110 comprises an external-cavity diode laser operating at about 1550 (i.e., $v_{pump}$ about 200 THz; any other suitable pump laser source operating at any suitable pump frequency can be employed) with an effective linewidth of about 50 kHz and is locked to a resonant frequency of the fiber-loop optical resonator 130 by a Pound-Drever-Hall mechanism 114 (e.g., a phase modulator, dithering frequency drive, mixer, and servo loop filter). Threshold pump power for laser oscillation at $v_1$ is about 0.6 mW, and increasing the pump power leads to laser oscillation at first $v_2$ and then $v_3$. Pump laser power is kept at or below about 9 mW to suppress multimode oscillation that begins to occur above that level of pump laser power. At 9 mW of pump laser power, the optical resonator 130 produces sufficient stimulated Brillouin laser output to deposit on the photodetector about 1.6 mW at $v_1$ and about 0.7 mW at $v_3$; corresponding optical spectra are shown in FIG. 2D. The fast photodetector 150 (an InGaAs photodiode in this example; any suitable photodetector can be employed) produces a photocurrent of about 1.4 mA at the beat frequency $f_M = v_1 - v_3$ of about 21.730 GHz. The spectrum of the amplified beat note is shown in FIGS. 2A and 2B. The measured noise spectrum is shown in FIG. 2C (lower curve) and shows a phase noise level of −115 dBc/Hz at 10 kHz offset. FIG. 2C also shows a $1/f^2$ dependence of the noise starting at about 3 Hz, indicative of Schawlow-Townes noise being the primary noise source. For comparison, FIGS. 2E and 2F show the spectrum and the upper curve of FIG. 2C shows the noise spectrum of a beat note generated at $v_{pump} - v_1$ (about 10.87 GHz) by beating the pump laser output at $v_{pump}$ against the first Stokes stimulated Brillouin laser output at $v_1$. Noise in the beat note generated from the pump and first Stokes exceeds that of the beat note generated by the first and third Stokes by 35 to 60 dB.

Figure 3B:
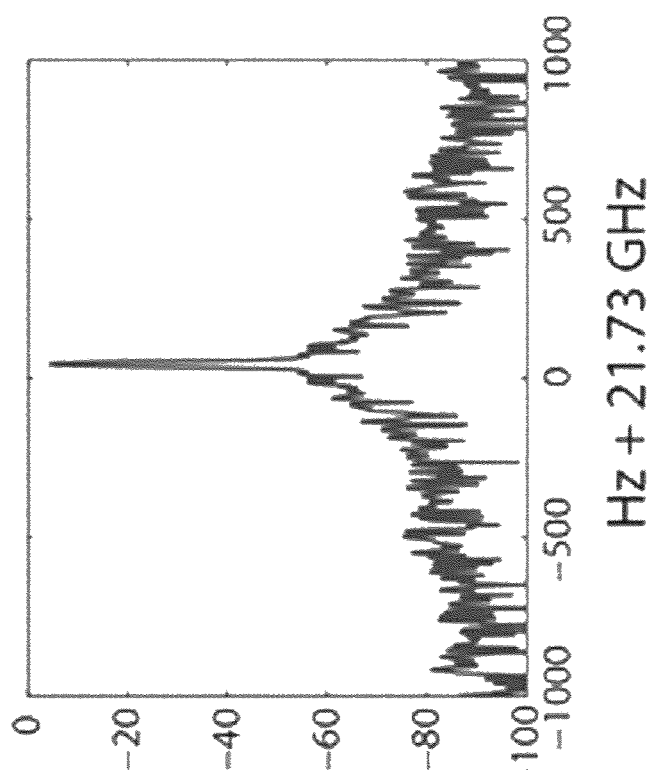
FIGS. 3A through 3C are plots characterizing performance of another example of an inventive microwave-frequency source arranged and operated according to the present disclosure.
Figure 3A:
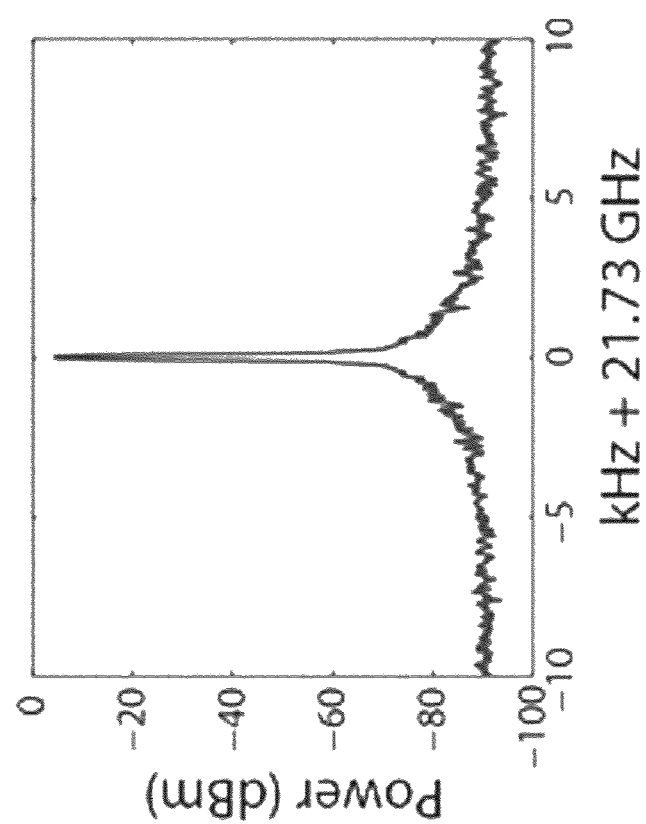
Figure 3C:
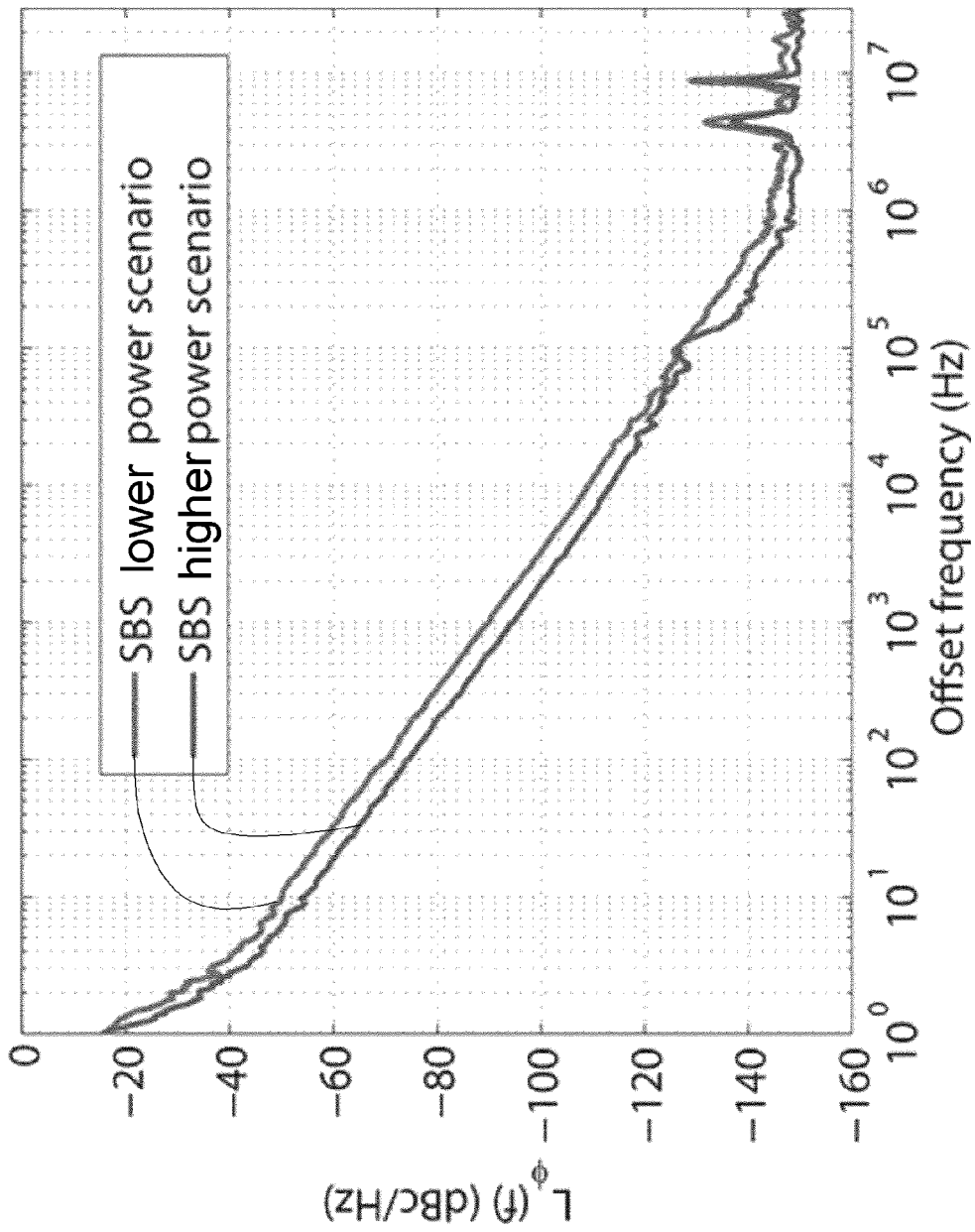

FIGS. 3A-3C illustrate the performance of another example of an inventive microwave-frequency source 100, which is the same as the preceding example except that the pump laser source is a fiber laser having an effective linewidth of about 1 kHz. FIGS. 3A and 3B are the spectra of the microwave-frequency output signal resulting from operation under the same conditions as in the preceding example. The noise spectra shown in FIG. 3C are obtained at a lower pump power (upper curve; about 0.9 mW at $v_1$ and about 0.24 mW at $v_3$) and at a higher pump power (lower curve; about 2.5 mW at $v_1$ and about 1.1 mW at $v_3$). Both of those curves again exhibit a $1/f^2$ dependence of the noise from about 3 Hz, as expected if the noise is primarily Schawlow-Townes noise. The upper curve of FIG. 3C closely matches the lower curve of FIG. 2C, produced with similar pump powers from difference pump laser sources (a noisier external-cavity diode laser in FIG. 2C; a less noisy fiber laser in FIG. 3C). Moreover, calculated Schawlow-Townes noise levels for the two pump power levels in FIG. 3C (−110 dBc/Hz at 10 kHz offset at the lower pump power and −115 dBc/Hz at 10 kHz offset at the higher pump power) are in excellent agreement with the measured noise values (−109 dBc/Hz at 10 kHz offset at the lower pump power and −114 dBc/Hz at 10 kHz offset at the higher pump power).

As already noted, the inventive microwave-frequency source exhibits exceptional frequency stability and exceptionally low levels of phase noise. In some examples, the output electrical signal has a bandwidth less than about 100 Hz over about a 1 second timescale; in some of those examples, the output electrical signal has a bandwidth less than about 1 Hz over about a 1 second timescale. In some examples, the output electrical signal exhibits a phase noise level less than about −30 dBc/Hz at 100 Hz offset frequency and less than about −90 dBc/Hz at 10 kHz offset frequency. In some of those examples, the output electrical signal exhibits a phase noise level less than about −70 dBc/Hz at 100 Hz offset frequency and less than about −110 dBc/Hz at 10 kHz offset frequency.

In addition to the preceding, the following examples fall within the scope of the present disclosure or appended claims:

EXAMPLE 1

A microwave-frequency source for generating an output electrical signal at an output frequency $f_M$, the microwave-frequency source comprising a pump laser source, an optical resonator, and a photodetector, wherein: (a) a free spectral range $v_{FSR}$ of the optical resonator is substantially equal to an integer submultiple of a Brillouin shift frequency $v_B$ of the optical resonator so that $v_B = M v_{FSR}$ where M is an integer; (b) the pump laser source is frequency-locked to a corresponding resonant optical mode of the optical resonator; (c) the pump laser source and the optical resonator are arranged so that pumping the optical resonator with output of the pump laser source at a pump frequency $v_{pump}$ results in stimulated Brillouin laser oscillation in the optical resonator at respective first, second, and third Stokes Brillouin-shifted frequencies $v_1 = v_{pump} - v_B$, $v_2 = v_{pump} - 2v_B$, and $v_3 = v_{pump} - 3v_B$; and (d) the photodetector is arranged to receive stimulated Brillouin laser outputs at the first and third Stokes Brillouin-shifted frequencies $v_1$ and $v_3$ and to generate therefrom the output electrical signal at a beat frequency $f_M = v_1 - v_3 = 2v_B$.

EXAMPLE 2

The microwave-frequency source of Example 1 wherein the first and third Stokes stimulated Brillouin laser outputs co-propagate along a common optical path from the optical resonator to the photodetector.

EXAMPLE 3

The microwave-frequency source of any one of Examples 1 or 2 wherein the optical resonator is structurally arranged so as to suppress stimulated Brillouin laser oscillation at a fourth Stokes Brillouin-shifted frequency $v_4 = v_{pump} - 4v_B$.

EXAMPLE 4

The microwave-frequency source of any one of Examples 1 through 3 wherein the free spectral range $v_{FSR}$ of the optical resonator is substantially equal to the Brillouin shift frequency $v_B$ of the optical resonator.

EXAMPLE 5

The microwave-frequency source of any one of Examples 1 through 4 wherein the optical resonator comprises silica and the Brillouin shift frequency $v_B$ of the optical resonator is about 10.87 GHz.

EXAMPLE 6

The microwave-frequency source of any one of Examples 1 through 5 wherein the optical resonator comprises a ring optical resonator.

EXAMPLE 7

The microwave-frequency source of Example 6 wherein the ring optical resonator comprises a disk optical resonator.

EXAMPLE 8

The microwave-frequency source of any one of Examples 6 or 7 wherein the pump laser source and the ring optical resonator are arranged so that pumping the ring optical resonator with the output of the pump laser source at the pump frequency $v_{pump}$ results in (i) backward-propagating stimulated Brillouin laser oscillation in the ring optical resonator at the respective first and third Stokes Brillouin-shifted frequencies $v_1$ and $v_3$ and (ii) forward-propagating stimulated Brillouin laser oscillation in the ring optical resonator at the second Stokes Brillouin-shifted frequency $v_2$.

EXAMPLE 9

The microwave-frequency source of any one of Examples 1 through 5 wherein the optical resonator comprises a fiber optical resonator.

EXAMPLE 10

The microwave-frequency source of Example 9 wherein the fiber optical resonator includes a fiber Bragg grating that is structurally arranged so as to suppress stimulated Brillouin laser oscillation at a fourth Stokes Brillouin-shifted frequency $v_4 = v_{pump} - 4v_B$.

EXAMPLE 11

The microwave-frequency source of any one of Examples 9 or 10 wherein the fiber optical resonator comprises a fiber Fabry-Perot optical resonator.

EXAMPLE 12

The microwave-frequency source of any one of Examples 9 or 10 wherein the fiber optical resonator comprises a fiber-loop optical resonator.

EXAMPLE 13

The microwave-frequency source of Example 12 wherein the pump laser source and the fiber-loop optical resonator are arranged so that pumping the fiber-loop optical resonator with the output of the pump laser source at the pump frequency $v_{pump}$ results in (i) backward-propagating stimulated Brillouin laser oscillation in the fiber-loop optical resonator at the respective first and third Stokes Brillouin-shifted frequencies $v_1$ and $v_3$ and (ii) forward-propagating stimulated Brillouin laser oscillation in the fiber-loop optical resonator at the second Stokes Brillouin-shifted frequency $v_2$.

EXAMPLE 14

The microwave-frequency source of any one of Examples 9 through 13 wherein the fiber optical resonator includes an optical fiber greater than or equal to about 20 meters long.

EXAMPLE 15

The microwave-frequency source of any one of Examples 9 through 13 wherein the fiber optical resonator includes an optical fiber greater than or equal to about 40 meters long.

EXAMPLE 16

The microwave-frequency source of any one of Examples 9 through 13 wherein the fiber optical resonator includes an optical fiber greater than or equal to about 100 meters long.

EXAMPLE 17

The microwave-frequency source of any one of Examples 9 through 13 wherein the fiber optical resonator includes an optical fiber greater than or equal to about 200 meters long.

EXAMPLE 18

The microwave-frequency source of any one of Examples 9 through 13 wherein the fiber optical resonator includes an optical fiber greater than or equal to about 500 meters long.

EXAMPLE 19

The microwave-frequency source of any one of Examples 1 through 18 wherein the output electrical signal has a bandwidth less than about 100 Hz over about a 1 second timescale.

EXAMPLE 20

The microwave-frequency source of Example 19 wherein the output electrical signal has a bandwidth less than about 1 Hz over about a 1 second timescale.

EXAMPLE 21

The microwave-frequency source of any one of Examples 1 through 20 wherein the output electrical signal exhibits a phase noise level less than about −30 dBc/Hz at 100 Hz offset frequency and less than about −90 dBc/Hz at 10 kHz offset frequency.

EXAMPLE 22

The microwave-frequency source of Example 21 wherein the output electrical signal exhibits a phase noise level less than about −70 dBc/Hz at 100 Hz offset frequency and less than about −110 dBc/Hz at 10 kHz offset frequency.

EXAMPLE 23

The microwave-frequency source of any one of Examples 1 through 22 wherein the pump laser source is frequency-locked to the corresponding resonant optical mode of the optical resonator by a Pound-Drever-Hall mechanism.

EXAMPLE 24

A method for generating a microwave-frequency output electrical signal using the microwave-frequency source of any one of Examples 1 through 23, the method comprising: (a) using the pump laser source, pumping the optical resonator so as to generate the stimulated Brillouin laser oscillation at the first, second, and third Stokes Brillouin-shifted frequencies; and (b) directing the stimulated Brillouin laser outputs at the first and third Stokes Brillouin-shifted frequencies onto the photodetector so as to generate the microwave-frequency output electrical signal at the frequency $f_M = 2v_B$.

EXAMPLE 25

The method of Example 24 further comprising suppressing stimulated Brillouin laser oscillation in the optical resonator at a fourth Stokes Brillouin-shifted frequency $v_4 = v_{pump} - 4v_B$.

EXAMPLE 26

The method of Example 25 wherein the optical resonator is structurally arranged so as to suppress stimulated Brillouin laser oscillation at the fourth Stokes Brillouin-shifted frequency $v_4 = v_{pump} - 4v_B$.

EXAMPLE 27

The method of Example 25 further comprising limiting output power of the pump laser source so as to suppress stimulated Brillouin laser oscillation at the fourth Stokes Brillouin-shifted frequency $v_4 = v_{pump} - 4v_B$.

EXAMPLE 28

The method of any one of Examples 24 through 27 further comprising limiting output power of the pump laser source so as to suppress multimode stimulated Brillouin laser oscillation in the optical resonator.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. In addition, for purposes of disclosure, each of the appended dependent claims shall be construed as if written in multiple dependent form and dependent upon all preceding claims with which it is not inconsistent. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof, unless explicitly stated otherwise.

In the appended claims, if the provisions of 35 USC §112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC §112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A microwave-frequency source for generating an output electrical signal at an output frequency $f_M$, the microwave-frequency source comprising a pump laser source, an optical resonator, and a photodetector, wherein:

(a) a free spectral range $v_{FSR}$ of the optical resonator is substantially equal to an integer submultiple of a Brillouin shift frequency $v_B$ of the optical resonator so that $v_B = Mv_{FSR}$ where M is an integer;

(b) the pump laser source is frequency-locked to a corresponding resonant optical mode of the optical resonator;

(c) the pump laser source and the optical resonator are arranged so that pumping the optical resonator with output of the pump laser source at a pump frequency $v_{pump}$ results in stimulated Brillouin laser oscillation in the optical resonator at respective first, second, and third Stokes Brillouin-shifted frequencies $v_1 = v_{pump} - v_B$, $v_2 = v_{pump} - 2v_B$, and $v_3 = v_{pump} - 3v_B$; and (d) the photodetector is arranged to receive stimulated Brillouin laser outputs at the first and third Stokes Brillouin-shifted frequencies $v_1$ and $v_3$ and to generate therefrom the output electrical signal at a beat frequency $f_M = v_1 - v_3 = 2v_B$.

2. The microwave-frequency source of claim 1 wherein the first and third Stokes stimulated Brillouin laser outputs co-propagate along a common optical path from the optical resonator to the photodetector.

3. The microwave-frequency source of claim 1 wherein the optical resonator is structurally arranged so as to suppress stimulated Brillouin laser oscillation at a fourth Stokes Brillouin-shifted frequency $v_4 = v_{pump} - 4v_B$.

4. The microwave-frequency source of claim 1 wherein the free spectral range $v_{FSR}$ of the optical resonator is substantially equal to the Brillouin shift frequency $v_B$ of the optical resonator.

5. The microwave-frequency source of claim 1 wherein the optical resonator comprises silica and the Brillouin shift frequency $v_B$ of the optical resonator is about 10.87 GHz.

6. The microwave-frequency source of claim 1 wherein the optical resonator comprises a ring optical resonator.

7. The microwave-frequency source of claim 6 wherein the ring optical resonator comprises a disk optical resonator.

8. The microwave-frequency source of claim 6 wherein the pump laser source and the ring optical resonator are arranged so that pumping the ring optical resonator with the output of the pump laser source at the pump frequency $v_{pump}$ results in (i) backward-propagating stimulated Brillouin laser oscillation in the ring optical resonator at the respective first and third Stokes Brillouin-shifted frequencies $v_1$ and $v_3$ and (ii) forward-propagating stimulated Brillouin laser oscillation in the ring optical resonator at the second Stokes Brillouin-shifted frequency $v_2$.

9. The microwave-frequency source of claim 1 wherein the optical resonator comprises a fiber optical resonator.

10. The microwave-frequency source of claim 9 wherein the fiber optical resonator includes a fiber Bragg grating that is structurally arranged so as to suppress stimulated Brillouin laser oscillation at a fourth Stokes Brillouin-shifted frequency $v_4 = v_{pump} - 4v_B$.

11. The microwave-frequency source of claim 9 wherein the fiber optical resonator comprises a fiber Fabry-Perot optical resonator.

12. The microwave-frequency source of claim 9 wherein the fiber optical resonator comprises a fiber-loop optical resonator.

13. The microwave-frequency source of claim 12 wherein the pump laser source and the fiber-loop optical resonator are arranged so that pumping the fiber-loop optical resonator with the output of the pump laser source at the pump frequency $v_{pump}$ results in (i) backward-propagating stimulated Brillouin laser oscillation in the fiber-loop optical resonator at the respective first and third Stokes Brillouin-shifted frequencies $v_1$ and $v_3$ and (ii) forward-propagating stimulated Brillouin laser oscillation in the fiber-loop optical resonator at the second Stokes Brillouin-shifted frequency $v_2$.

14. The microwave-frequency source of claim 9 wherein the fiber optical resonator includes an optical fiber greater than or equal to about 20 meters long.

15. The microwave-frequency source of claim 9 wherein the fiber optical resonator includes an optical fiber greater than or equal to about 40 meters long.

16. The microwave-frequency source of claim 9 wherein the fiber optical resonator includes an optical fiber greater than or equal to about 100 meters long.

17. The microwave-frequency source of claim 9 wherein the fiber optical resonator includes an optical fiber greater than or equal to about 200 meters long.

18. The microwave-frequency source of claim 9 wherein the fiber optical resonator includes an optical fiber greater than or equal to about 500 meters long.

19. The microwave-frequency source of claim 1 wherein the output electrical signal has a bandwidth less than about 100 Hz over about a 1 second timescale.

20. The microwave-frequency source of claim 1 wherein the output electrical signal has a bandwidth less than about 1 Hz over about a 1 second timescale.

21. The microwave-frequency source of claim 1 wherein the output electrical signal exhibits a phase noise level less than about −30 dBc/Hz at 100 Hz offset frequency and less than about −90 dBc/Hz at 10 kHz offset frequency.

22. The microwave-frequency source of claim 1 wherein the output electrical signal exhibits a phase noise level less than about −70 dBc/Hz at 100 Hz offset frequency and less than about −110 dBc/Hz at 10 kHz offset frequency.

23. The microwave-frequency source of claim 1 wherein the pump laser source is frequency-locked to the corresponding resonant optical mode of the optical resonator by a Pound-Drever-Hall mechanism.

24. A method for generating a microwave-frequency output electrical signal using the microwave-frequency source of claim 1, the method comprising:
(a) using the pump laser source, pumping the optical resonator so as to generate the stimulated Brillouin laser oscillation at the first, second, and third Stokes Brillouin-shifted frequencies; and
(b) directing the stimulated Brillouin laser outputs at the first and third Stokes Brillouin-shifted frequencies onto the photodetector so as to generate the microwave-frequency output electrical signal at the frequency $f_M=2v_B$.

25. A method for generating a microwave-frequency output electrical signal at an output frequency $f_M$, the method comprising:
(a) using a pump laser source, pumping at a pump frequency $v_{pump}$ an optical resonator so as to generate stimulated Brillouin laser outputs at respective first and third Stokes Brillouin-shifted frequencies $v_1=v_{pump}-v_B$ and $v_3=v_{pump}-3v_B$, where $v_B$ is a Brillouin shift frequency of the optical resonator; and
(b) directing the stimulated Brillouin laser outputs at the first and third Stokes Brillouin-shifted frequencies onto a photodetector so as to generate an output electrical signal at a beat frequency $f_M=v_1-v_3=2v_B$,
wherein:
(c) a free spectral range $v_{FSR}$ of the optical resonator is substantially equal to an integer submultiple of the Brillouin shift frequency $v_B$ of the optical resonator so that $v_B=Mv_{FSR}$ where M is an integer;
(d) the pump laser source is frequency-locked to a corresponding resonant optical mode of the optical resonator;
(e) the pump laser source and the optical resonator are arranged so that pumping the optical resonator with output of the pump laser source at the pump frequency $v_{pump}$ results in stimulated Brillouin laser oscillation in the optical resonator at the respective first, second, and third Stokes Brillouin-shifted frequencies $v_1=v_{pump}-v_B$, $v_2=v_{pump}-2v_B$, and $v_3=v_{pump}-3v_B$; and
(d) the photodetector is arranged to receive the first and third Stokes stimulated Brillouin laser outputs and to generate therefrom the output electrical signal at the beat frequency $f_M=v_1-v_3=2v_B$.

26. The method of claim 25 further comprising suppressing stimulated Brillouin laser oscillation in the optical resonator at a fourth Stokes Brillouin-shifted frequency $v_4=v_{pump}-4v_B$.

27. The method of claim 26 wherein the optical resonator is structurally arranged so as to suppress stimulated Brillouin laser oscillation at the fourth Stokes Brillouin-shifted frequency $v_4=v_{pump}-4v_B$.

28. The method of claim 26 further comprising limiting output power of the pump laser source so as to suppress stimulated Brillouin laser oscillation at the fourth Stokes Brillouin-shifted frequency $v_4=v_{pump}-4v_B$.

29. The method of claim 25 further comprising limiting output power of the pump laser source so as to suppress multimode stimulated Brillouin laser oscillation in the optical resonator.

* * * * *